US008467559B2

(12) United States Patent
Zhe

(10) Patent No.: US 8,467,559 B2
(45) Date of Patent: *Jun. 18, 2013

(54) SILICON MICROPHONE WITHOUT DEDICATED BACKPLATE

(75) Inventor: Wang Zhe, Singapore (SG)

(73) Assignee: Shandong Gettop Acoustic Co., Ltd., Shandong (CN)

( * ) Notice: Subject to any disclaimer, the term of this patent is extended or adjusted under 35 U.S.C. 154(b) by 1080 days.

This patent is subject to a terminal disclaimer.

(21) Appl. No.: 12/070,575

(22) Filed: Feb. 20, 2008

(65) Prior Publication Data

US 2009/0208037 A1    Aug. 20, 2009

(51) Int. Cl.
    *H04R 9/08*         (2006.01)
(52) U.S. Cl.
    USPC .............................. 381/369; 381/174; 381/175
(58) Field of Classification Search
    USPC .......................................... 381/369, 174, 175
    See application file for complete search history.

(56) References Cited

U.S. PATENT DOCUMENTS

| | | | |
|---|---|---|---|
| 4,006,317 A | 2/1977 | Freeman | |
| 6,535,460 B2 | 3/2003 | Loeppert et al. | |
| 7,329,933 B2 | 2/2008 | Zhe et al. | |
| 2003/0133588 A1* | 7/2003 | Pedersen | 381/423 |
| 2006/0093170 A1* | 5/2006 | Zhe et al. | 381/191 |
| 2007/0284682 A1* | 12/2007 | Laming et al. | 257/416 |
| 2008/0031476 A1 | 2/2008 | Wang et al. | |
| 2009/0092273 A1* | 4/2009 | Zhe et al. | 381/361 |

FOREIGN PATENT DOCUMENTS

| | | |
|---|---|---|
| WO | WO 2006/046927 | 5/2006 |
| WO | PCT/SG 2009/000049 | 5/2009 |

OTHER PUBLICATIONS

Co-pending US Patent SI07-003, U.S. Appl. No. 11/973,075, filed Oct. 5, 2007, "Silicon Microphone with Enhanced Impact Proof Structure Using Bonding Wires," assigned to the same assignee as the present invention.

* cited by examiner

*Primary Examiner* — Thao Le
*Assistant Examiner* — Matthew Gordon
(74) *Attorney, Agent, or Firm* — Saile Ackerman LLC; Stephen B. Ackerman

(57) ABSTRACT

Various embodiments of a silicon microphone sensing element without dedicated backplate are disclosed. The microphone sensing element has a circular or polygonal diaphragm with a plurality of perforated springs suspended above the front side of a conductive substrate. The diaphragm is aligned above one or more back holes in the substrate having a front opening smaller than the diaphragm. In one embodiment, a continuous perforated spring surrounds the diaphragm and has a shape that conforms to the diaphragm. A plurality of perforated beams connects the spring to rigid pads that anchor the movable diaphragm and spring. In another embodiment, there is a plurality of perforated springs having double or triple folding configurations and a plurality of perforated beams connecting the diaphragm to rigid pads. Also disclosed is a scheme to integrate the silicon microphone sensing element with CMOS devices on a single chip.

22 Claims, 8 Drawing Sheets

SILICON MICROPHONE WITHOUT DEDICATED BACKPLATE

RELATED PATENT APPLICATIONS

This application is related to the following: Ser. No. 11/500,114, filing date Aug. 7, 2006; Ser. No. 10/977,692, filed on Oct. 29, 2004; Ser. No. 10/977,693, filing date Oct. 29, 2004; and Ser. No. 11/973,075, filing date Oct. 5, 2007; all of which are assigned to a common assignee and are herein incorporated by reference in their entirety.

FIELD OF THE INVENTION

The invention relates to a sensing element of a silicon condenser microphone and a method for making the same, and in particular, to various embodiments of a silicon microphone structure without a dedicated backplate that has movable springs and diaphragm that are attached to rigid anchor pads.

BACKGROUND OF THE INVENTION

The silicon condenser microphone is typically comprised of two basic elements which are a sensing element and a pre-amplifier IC device. The sensing element is basically a variable capacitor constructed with a movable compliant diaphragm, a rigid and fixed perforated backplate, and a dielectric spacer to form an air gap between the diaphragm and backplate. The pre-amplifier IC device is basically configured with a voltage bias source (including a bias resistor) and a source follower preamplifier. Although there have been numerous embodiments of the variable capacitor on silicon substrates, each prior art reference included in related patent application Ser. No. 10/977,692 has a dedicated backplate in the construction of the microphone sensing element.

The inclusion of a dedicated backplate in the microphone sensing element normally leads to manufacturing complications due to its special definitions in material and processing method. The required photolithographic masking levels as well as the processing issues relating to overlay and spacing between the diaphragm and backplate normally result in a complex and high cost fabrication.

Therefore, a simply defined silicon microphone structure is needed that enables the fabrication process to be simplified at a reduced cost. In particular, a novel design for the variable capacitor component is desirable so that fewer masking levels are needed to produce a microphone sensing element. Advanced designs are needed to accommodate various shapes and features in a silicon microphone device that will provide more flexibility in terms of movable parts and thereby lead to better reliability. An advanced design in which a silicon microphone structure can be integrated with a CMOS device would be especially advantageous.

An improved design with regard to better impact reliability has been disclosed in related patent application Ser. No. 11/973,075 which includes a means for using bonding wires to constrain the vibration of the diaphragm in a direction away from the substrate.

SUMMARY OF THE INVENTION

One objective of the present invention is to provide a microphone sensing element that does not include a dedicated backplate component.

A further objective of the present invention is to provide a microphone sensing element without a dedicated backplate component that has various configurations for providing capacitive sensing.

These objectives are achieved with a microphone sensing element which in its most basic embodiment features a movable diaphragm having a circular, square, rectangular, or polygonal shape that is supported along one or more sides or corners by mechanical springs that are anchored to a conductive substrate through rigid pads. The mechanical springs may be solid or have perforations. Each rigid pad (anchor) may be disposed on a dielectric layer which acts as a spacer to define an air gap between the diaphragm and substrate. A back hole having a shape that may conform to the diaphragm shape is formed in the substrate below the diaphragm. Preferably, the back hole has a geometric area on the front side of the substrate that is smaller than the geometric area of the diaphragm in a plane parallel to the substrate. Attached to the diaphragm are a plurality of perforated plates which are made from the same material layer as the diaphragm, rigid pads, and mechanical springs. Preferably, the perforated plates have a shape that conforms to the outer edge of the diaphragm. One or more of the pads have an overlying first electrode which is an island of a conductive metal material. A second electrode of the same material composition is formed on the conductive substrate or on a conductive surface that is disposed on a non-conductive substrate. The two electrodes are wired to complete a variable capacitor circuit. All movable parts including the perforated plates, mechanical springs, and a certain portion of the diaphragm overlapping the substrate contribute to capacitive sensing.

In the most basic embodiment, the mechanical springs serve not only to control the compliance of the diaphragm but also contribute to the capacitive sensing. In one aspect, the perforated plate functionality is not a separate element and may be combined with that of the mechanical springs as long as one or more perforated springs have sufficient area to provide the necessary capacitive sensing. Therefore, the most basic embodiment may be further simplified to combine the perforated plates and mechanical springs into one or more perforated mechanical springs.

Similarly, another simplified embodiment is configured with a square shaped diaphragm and a plurality of "L" shaped perforated springs each having two ends in which one end is attached to the outer edge of a diaphragm and the other end connects to a rigid pad. A back hole underlying the diaphragm may have a square shape. The base of each "L" shaped spring adjoins a side of the diaphragm while the long side of the "L" shape is formed parallel to the side where the base is attached. Capacitive sensing is achieved by establishing a circuit between a first electrode formed on one of the rigid pads and a second electrode formed on a silicon substrate.

An advantageous feature of a backplateless silicon microphone as described herein lies in its feasibility of integration with CMOS circuits. A typical embodiment for integration with CMOS circuits can be realized using a Silicon-On-Insulator (SOI) substrate. The pads, diaphragm, and perforated springs are made of a silicon device layer on the SOI substrate. The perforated springs and pads are separated from the surrounding device layer by a plurality of slot openings. One or more CMOS circuits are formed in the surrounding silicon device layer wherein a CMOS circuit is electrically connected by a via onto an overlying pad that represents a first electrode. A second electrode on the substrate is connected to the CMOS circuit by another via. As a result, the backplateless silicon microphone device is integrated with CMOS ASIC for either analog or digital outputs.

Various backplateless silicon microphone structures are additional embodiments that encompass essentially all of the elements and features of FIGS. 7a, 10-12 in related patent application Ser. No. 11/973,075. The plurality of slots within each spring and the continuous slot surrounding the plurality of rigid pads and adjoining mechanical spring are retained in these embodiments.

A method of fabricating all of the embodiments described herein has been provided in the related patent applications mentioned previously. Modifications such as the CMOS embodiment may be produced by methods well known to those skilled in the art.

DETAILED DESCRIPTION OF THE INVENTION

Figure 1:
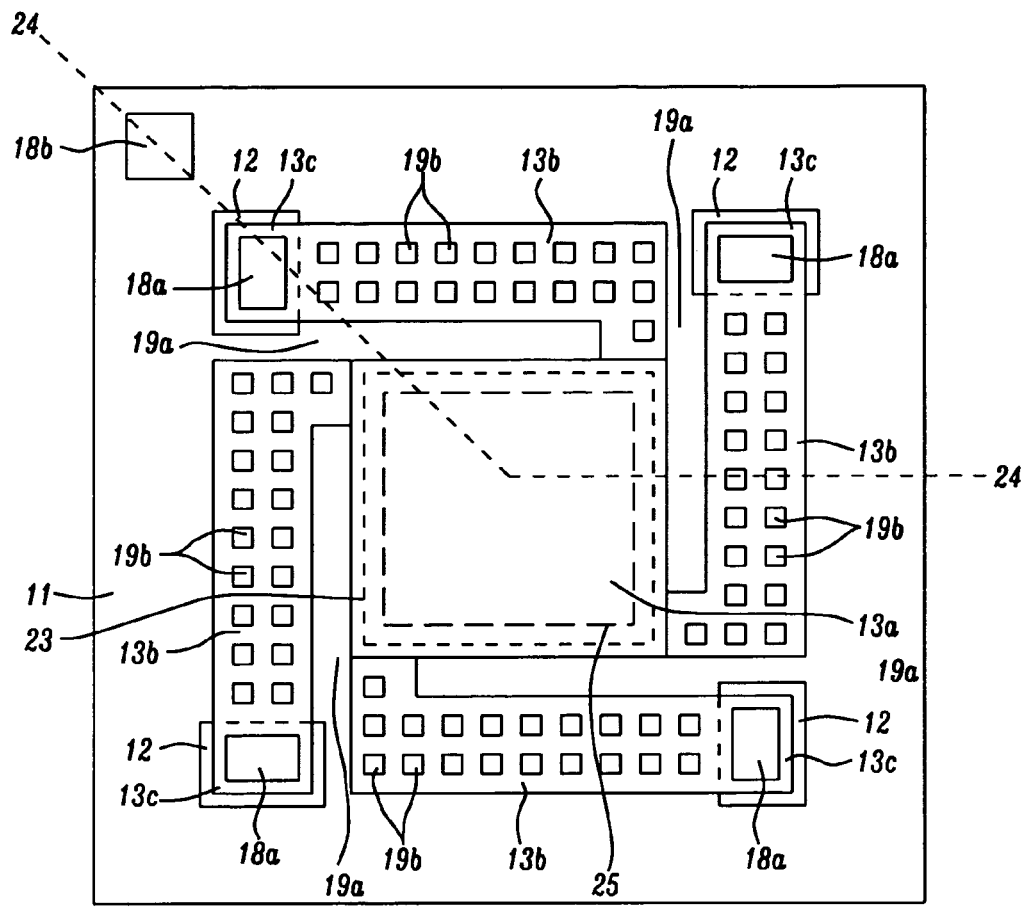
FIG. 1 is a top view depicting a diaphragm with adjoining perforated springs that terminate in pads according to a first embodiment of the present invention.

The present invention is a sensing element for a capacitive condenser type of microphone that can readily be made with existing semiconductor materials and silicon micromachining processes. The figures are not necessarily drawn to scale and the relative sizes of various elements in the structures may be different than in an actual device. It should be understood that in addition to a microphone sensing element, a silicon microphone is also comprised of a voltage bias source, a source follower preamplifier, and wiring to connect two electrodes to complete a variable capacitor circuit. However, these features are not shown in order to simplify the drawings and direct attention to the key components of the present invention.

The present invention is based on the discovery that a high performance microphone sensing element may be constructed without a dedicated backplate. A microphone working capacitance is achieved through a variable capacitor circuit which includes a conductive substrate having a back hole formed therein and a movable diaphragm affixed with either perforated plates and supporting springs or with perforated mechanical springs above the substrate.

Various embodiments of a microphone sensing element in the spirit of the present invention have been previously described in Silicon Matrix Pte. Ltd. patent application Ser. Nos. 10/977,692, 11/500,114, and 11/973,075 which are herein fully incorporated by reference in their entirety. These embodiments include the features of a movable diaphragm having a circular, square, rectangular, or polygonal shape that is supported along one or more sides or corners by mechanical springs that are anchored to a conductive substrate through rigid pads. The supporting springs may be solid or have perforations. Each rigid pad (anchor) may be disposed on a dielectric layer which acts as a spacer to define an air gap between the diaphragm and substrate. The diaphragm may also be attached to a plurality of plates that are solid or perforated and are made from the same material layer as the diaphragm, pads, and supporting springs. Preferably, the plates have a shape that conforms to the outer edge of the diaphragm. One or more of the pads have an overlying first electrode which is an island of a conductive metal material that is connected by wiring to external circuitry. A second electrode of the same material composition is formed on the conductive substrate or on a conductive surface that is connected to the substrate and is wired to complete a variable capacitor circuit. A back hole having a shape that may conform to the diaphragm shape is formed in the substrate below the diaphragm and preferably has a geometric area on the front side of the substrate that is smaller than the geometric area of the diaphragm.

A method for forming a backplateless silicon microphone device was previously described in related patent application Ser. No. 10/977,692. It should be understood that the method may be easily modified by replacing a single dielectric spacer layer with a composite spacer found in various new embodiments disclosed herein and embodiments with perforated mechanical springs only may be fabricated by employing the same steps used to make a silicon microphone having both perforated plates and springs. Moreover, the previously described etch process to form openings in the membrane layer may be expanded in scope to include the simultaneous formation of slot openings within and adjacent to perforated springs that are included in various new embodiments.

The inventor has discovered additional design improvements that may be employed to enhance the performance of a silicon microphone device without a dedicated backplate. Several new embodiments are provided herein that relate to advances in silicon microphone technology over the prior art.

Referring to FIGS. 1-6, various embodiments of a backplateless silicon microphone 10 are depicted and include a diaphragm 13a that is supported along an outer edge by a plurality of perforated springs 13b which are made of the same membrane layer and have the same thickness as the diaphragm. The silicon microphone 10 is formed on a substrate 11 that may be comprised of doped silicon having a low resistivity, silicon having a conductive layer formed thereon, glass having a conductive layer formed thereon, or silicon having a composite layer formed thereon. The membrane layer including diaphragm 13a, perforated springs 13b, rigid pads 13c, and device areas 13e, 13f is preferably a single or composite film comprised of single crystalline silicon, polycrystalline silicon, silicon nitride, Au, Cu, Ni, Al, or other metal materials that may be alloys. The perforated springs 13b, rigid pads 13c, and diaphragm 13a are separated from other portions of the membrane layer including device areas 13e, 13f in FIGS. 5a-6b by a continuous slot 27. Note that in FIG. 5b certain portions of the continuous slot 27 are covered by dielectric layer 29. In FIGS. 1-4, there is a wide slot represented by portions of uncovered substrate 11 surrounding the movable elements 13a-13c and separating the aforementioned elements from the rigid membrane layer (not shown).

Referring to FIG. 1, a first embodiment is shown wherein the diaphragm 13a has a square or rectangular shape although a circular or polygonal shape is also acceptable. Each side adjoins an "L" shaped perforated spring 13b with holes 19b and that has a lengthwise direction which is parallel to the nearest diaphragm side. Each "L" shaped perforated spring adjoins the diaphragm 13a on one end and on the other end is connected to a rigid anchor pad 13c. In this configuration, each perforated mechanical spring 13b hereafter referred to as a perforated spring combines the features of the perforated spring 13b and perforated plate 13d that were originally described in related patent application Ser. No. 10/977,692. The term "spring" is used to describe a supporting means to control the compliance of the diaphragm 13a with respect to sound pressure. The vibration of the perforated spring 13b together with the diaphragm 13a also contributes to the capacitance change of the variable capacitor circuit formed between the first and second electrodes, 18a and 18b, respectively. Perforations consist of holes 19b that may be arranged in various patterns. The holes are needed to allow air ventilation and thus reduce the air damping in the narrow air gap (not shown) during vibrations. There is also a gap 19a formed between a long side of each perforated spring 13b and the diaphragm 13a and each gap 19a separates a rigid pad 13c adjoined to one perforated spring from an adjacent perforated spring.

It should be understood by those skilled in the art that when one or more perforated springs 13b has enough area to contribute to the capacitance sensing, there is no need to include a separate perforated plate element in the backplateless silicon microphone and a perforated spring and perforated plate may be considered as the same structural element. Furthermore, a perforated spring 13b may have a rectangular, "U" shape, or "L" shape. The present invention also encompasses an embodiment in which a perforated spring 13b may have a shape that combines two or more of the rectangular, "U" and "L" shapes. Moreover, one or more perforated springs 13b may have a first shape and one or more perforated springs may have a second shape that are selected from the rectangular, "U", and "L" shapes.

The pads 13c are anchored to the substrate 11 through a spacer that is preferably a dielectric layer 12 so that the diaphragm 13a and perforated springs 13b are electrically isolated from the substrate and are suspended over an air gap and a back hole (not shown) through which a sound signal may pass to induce a vibration in the diaphragm. In one aspect, the dielectric layer 12 is comprised of silicon oxide. Optionally, the dielectric layer 12 may be a single layer or composite layer comprised of one or more of a thermal oxide, a low temperature oxide, a tetraethoxyorthosilicate (TEOS) layer, a PSG layer, frit glass, or a silicon nitride. Ribs 23 are formed on the bottom surface of the diaphragm 13a and face the back hole 25. Preferably, the ribs 23 are positioned near the outer edge of the diaphragm 13a and outside the back hole 25. A method of forming a silicon microphone element without a backplate was previously described in related patent application Ser. No. 10/977,692 and includes a deep reactive ion etch of silicon or an anisotropic wet etch with KOH, for example, to form a back hole.

There is a contact or first electrode 18a comprised of metal or metal alloy such as Cr/Au above each pad 13c that serves as a connecting point to external wiring. Additionally, there are one or more second electrodes 18b with the same composition as a first electrode located on the front side of the substrate 11. A first electrode and second electrode are connected by wiring (not shown) to form a variable capacitor circuit. For an illustrative purpose, the first and second electrodes 18a, 18b are shown as square in shape although rounded corners, circular shapes, or polygonal shapes may be adopted. A first electrode 18a preferably has a smaller geometric area than that of a pad 13c to allow for some overlay error during the fabrication process. Optionally, first and second electrodes 18a, 18b may be a single or composite layer comprised of Al, Ti, Ta, Ni, Cu, W, or other metal materials including alloys thereof.

Figure 2:
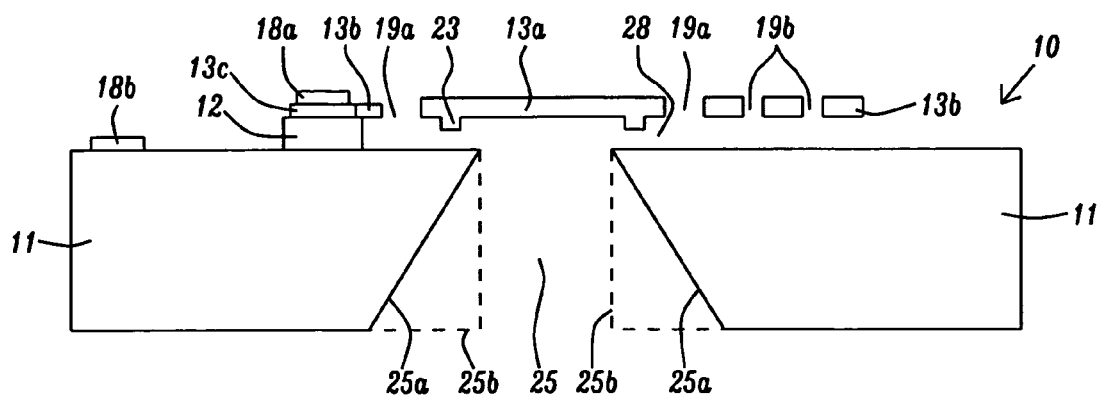
FIG. 2 is a cross-sectional view of the microphone sensing element shown in FIG. 1.

The first embodiment is further illustrated in a cross-sectional view in FIG. 2 that is obtained from the cross-section along the dashed line 24-24 (FIG. 1). Note that the back hole 25 may have sloping sidewalls 25a and is aligned below the diaphragm 13a and an air gap 28 in the spacer (dielectric layer 12) that separates the perforated mechanical springs 13b from the substrate 11. Optionally, the back hole 25 may have vertical sidewalls 25b. A vibration induced by a sound signal (not shown) that passes through the back hole 25 and impinges on the backside of the diaphragm 13a will cause a change in capacitance in the variable capacitor circuit that is converted into a low impedance voltage output by a source follower preamplifier. Thus, capacitive sensing is realized by employing a movable element (diaphragm and perforated spring) and a fixed element (silicon substrate). It should be understood that the portion of the diaphragm that overlaps the substrate 11 contributes to capacitive sensing and not the portion of the diaphragm above back hole 25.

Figure 3:
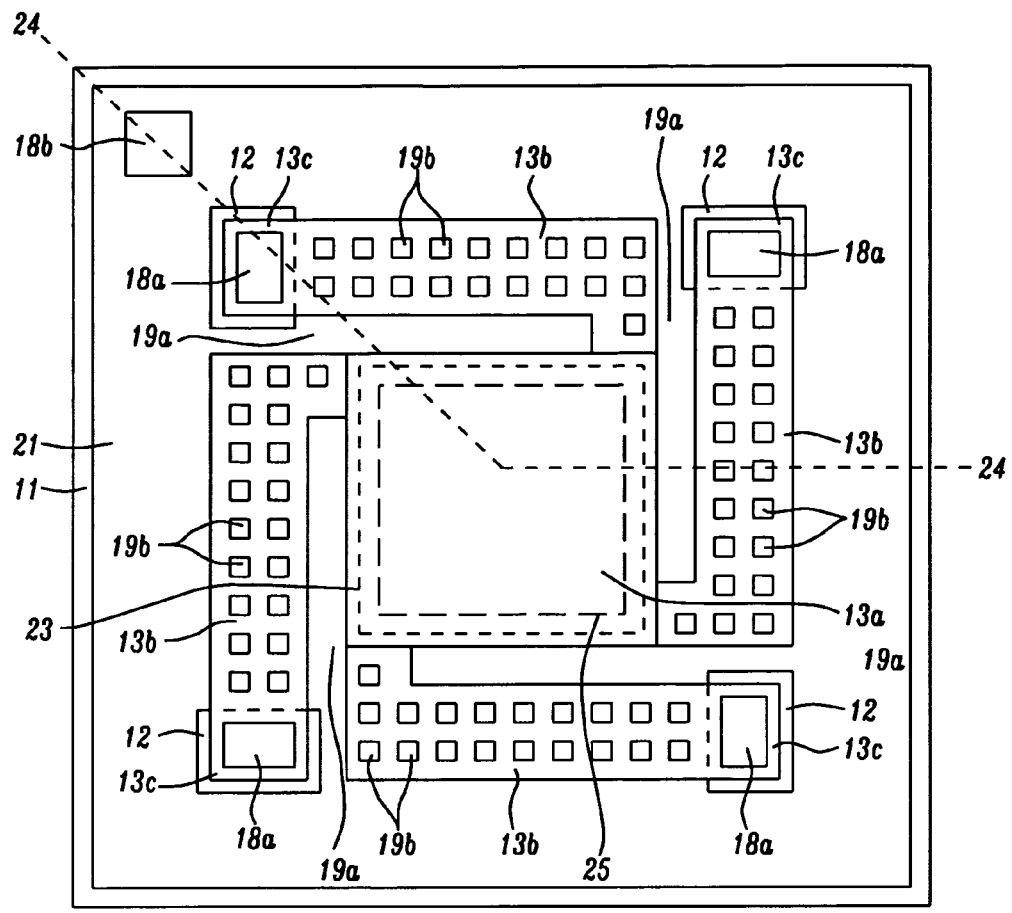
FIG. 3 is a top view depicting a diaphragm with adjoining perforated springs similar to the first embodiment but with an additional feature of a dielectric layer and overlying conductive layer formed between the substrate and dielectric spacer layer.

Referring to FIG. 3, a second embodiment is illustrated which retains the elements of the first embodiment but includes additional features comprised of a dielectric layer (not shown) on the substrate 11 and a conductive layer 21 on the dielectric layer. In this design, a variable capacitor circuit is established with a first electrode 18a and a second electrode 18b. However, in this case, capacitive sensing is realized by employing a movable element (diaphragm and perforated springs) and a fixed element that is the conductive layer 21.

Figure 4:
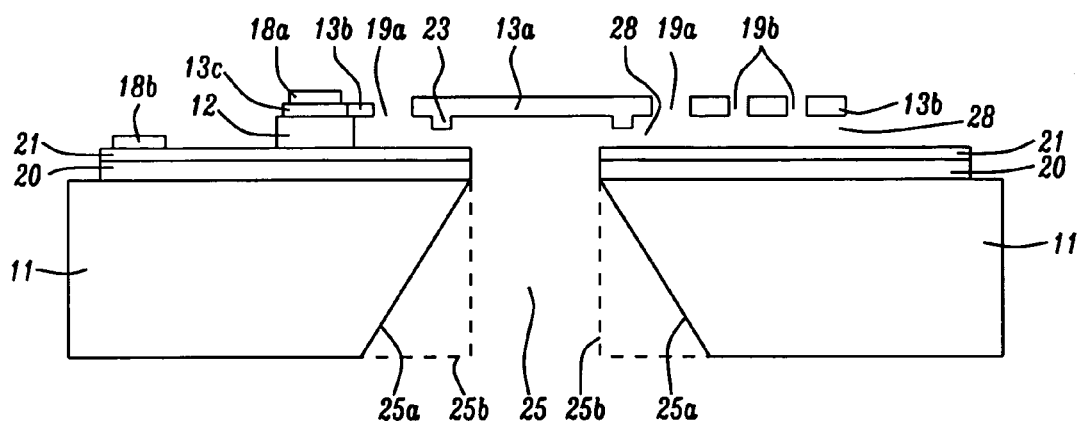
FIG. 4 is a cross-sectional view of the microphone sensing element shown in FIG. 3 according to a second embodiment of the present invention.

A cross-sectional view of the second embodiment is shown in FIG. 4. The dielectric layer 20 may be comprised of the same material as in dielectric layer 12 and is formed on the substrate 11. Conductive layer 21 is disposed on the dielectric layer 20 and may be comprised of a doped polysilicon layer, a doped silicon layer, or other metal materials. Note that the back hole 25 is extended vertically from the front side of the substrate 11 through the dielectric layer 20 and conductive layer 21 to allow a sound signal to pass through the back hole and air gap 28 and impinge on the back side of the diaphragm 13a between ribs 23. Dielectric layer 12 serves as a spacer between the conductive layer 21 and the plurality of rigid pads 13c and is formed only in locations below the rigid pads. A second electrode 18b is formed on the conductive layer 21 at one or more locations outside the perforated mechanical springs 13b with respect to diaphragm 13a.

Figure 5A:
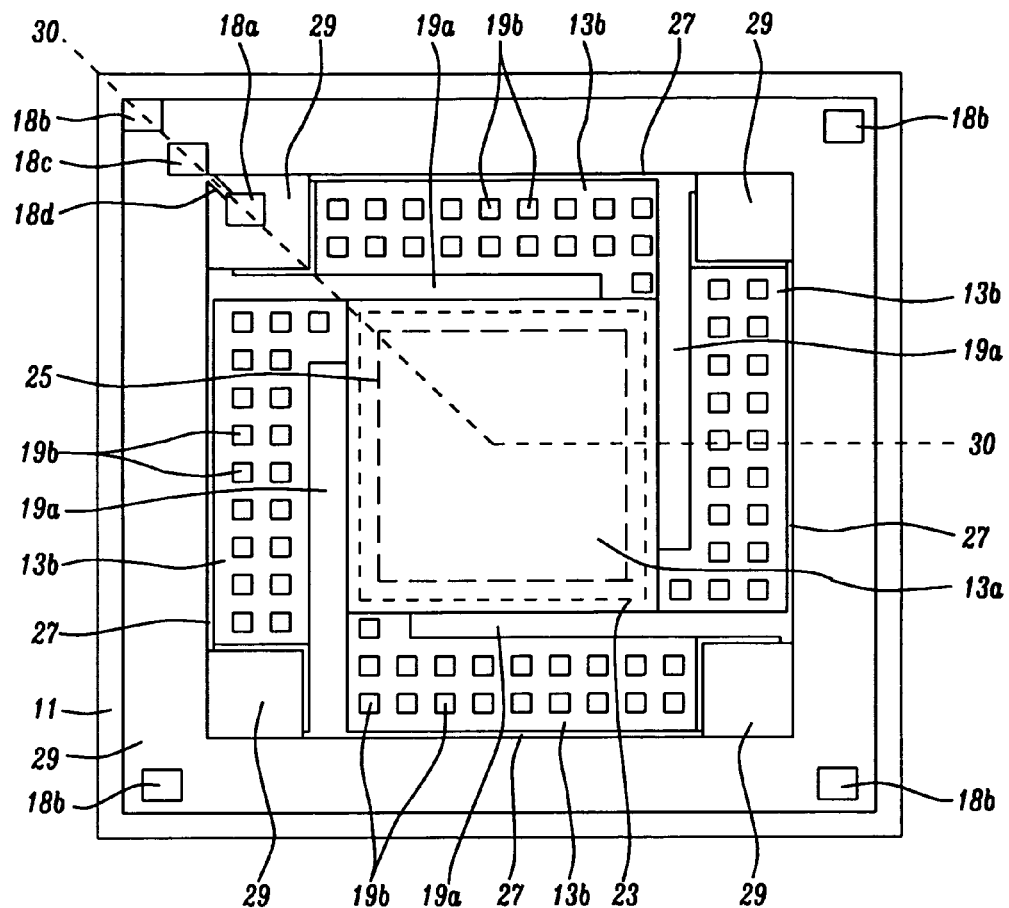
FIGS. 5a and 5b are a top view and cross-sectional view, respectively, of a microphone sensing element that has an SOI substrate and is integrated with CMOS circuits according to a third embodiment.

Referring to FIG. 5a, a third embodiment is shown that represents another modification of the backplateless silicon microphone element in FIG. 1 for integration with CMOS circuits. The third embodiment is implemented on a silicon-on-insulation (SOI) wafer wherein a buried oxide (BOX) layer 26 which may be either a thermally grown silicon oxide or a buried silicon oxide formed by an oxygen implant (SI-MOX) as a spacer between the substrate 11 and membrane layer from which the diaphragm 13a, perforated springs 13b, and pads 13c are made. The membrane layer is the SOI device layer that may be a doped silicon layer, or an undoped silicon layer with doped polysilicon, aluminum, or other semiconductor metal materials formed thereon.

Figure 5B:
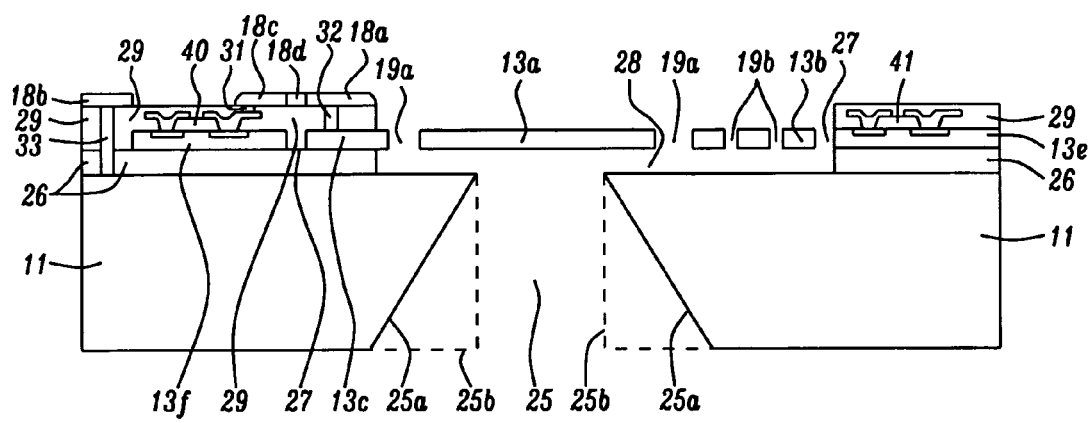

In the exemplary embodiment shown in FIG. 5b which is a view taken along the plane 30-30 (FIG. 5), sections 13e, 13f are CMOS devices that are formed outside of the perforated mechanical springs relative to the diaphragm 13a. Sections 13e, 13f are separated from perforated springs 13b and pads 13c by a continuous slot 27. To simplify the illustration, CMOS devices are indicated by a transistor 40 formed on the device layer section 13f, and a second transistor 41 formed on the device layer section 13e. Above sections 13e, 13f is a dielectric layer 29 that surrounds transistor 41 and may be comprised of an oxide or a composite including an oxide and a nitride. Likewise, dielectric layer 29 surrounds and covers transistor 40. A portion of dielectric layer 29 adjacent to device layer section 13f is disposed on the BOX oxide layer 26.

First electrode 18a in previous embodiments is now regarded as a via pad 18a that is formed on dielectric layer 29 above rigid anchor pad 13c. There is a via stud 32 that connects via pad 18a to a rigid pad 13c. Furthermore, there is a conductive line 18d formed on dielectric layer 29 that connects via pad 18a to a CMOS pad 18c which in turn is connected to underlying CMOS transistor 40 by a via stud 31. CMOS pad 18c and a second via pad 18b are also formed on the dielectric layer 29 and are coplanar with via pad 18a. CMOS pad 18c and conductive line 18d may be comprised of the same conductive material as in via pads 18a, 18b. Second via pad 18b is equivalent to the second electrode in previous embodiments and is connected to substrate 11 by a via stud 33. As a result, a variable capacitor circuit established between via pad 18a and via pad 18b is connected to a CMOS device (CMOS transistor 40). In this embodiment, capacitive sensing is realized by electrical connections to a movable element (diaphragm and perforated spring) and a fixed element (silicon substrate). In addition, the backplateless silicon microphone device is integrated with a CMOS ASIC device for analog or digital outputs.

Figure 6A:
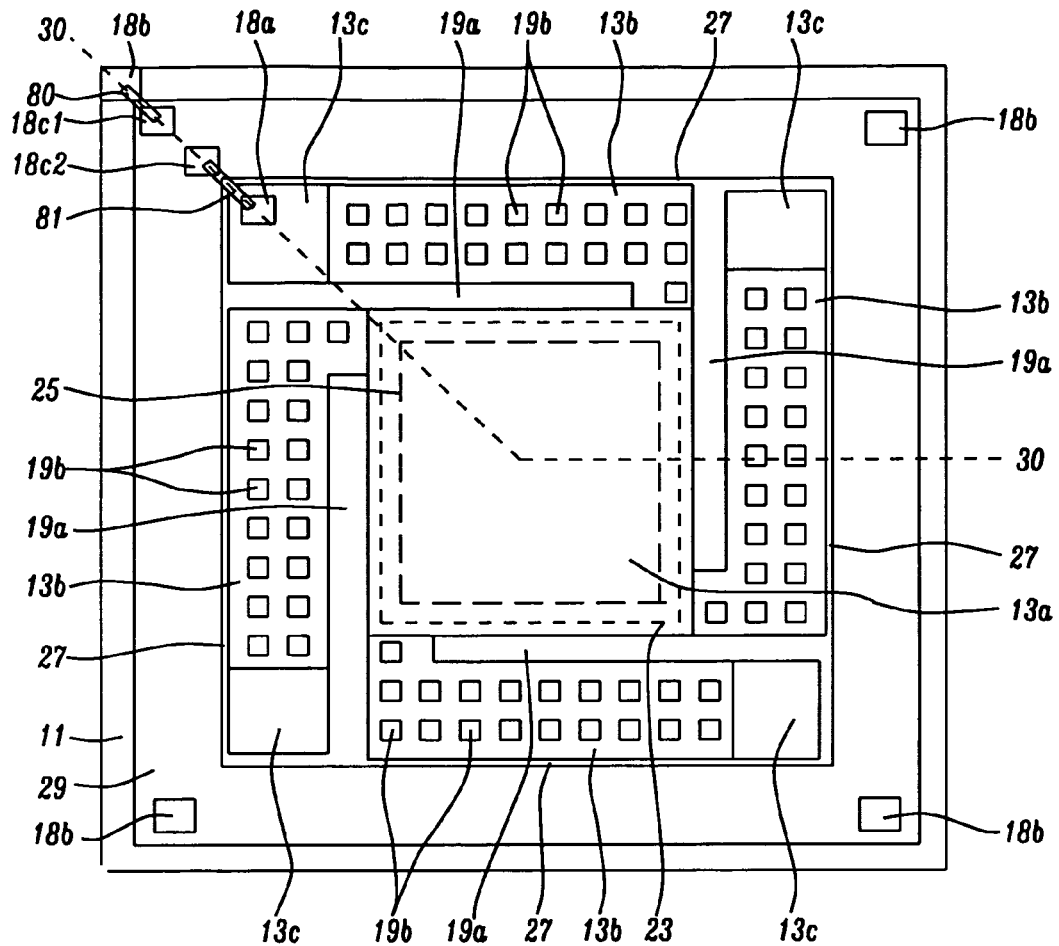
FIGS. 6a and 6b are a top view and cross-sectional view, respectively, of a microphone sensing element with an SOI substrate that is integrated with CMOS circuits using wire bonding according to a fourth embodiment.
Figure 6B:
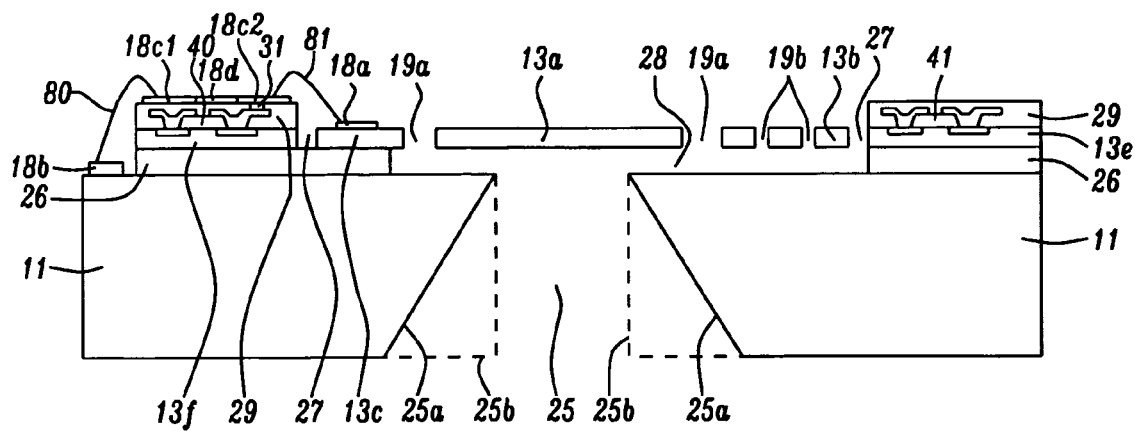

Referring to FIG. 6a, another SOI embodiment is depicted in which the first electrode 18a is now formed on a rigid pad 13c and is connected to a CMOS pad 18c2 by a bonding wire 81. CMOS pad 18c2 is connected to transistor 40 by a via 31 as in the prior embodiment. CMOS pad 18c1 and CMOS pad 18c2 are formed on the dielectric layer 29. Note that CMOS device layer section 13f is separated from the rigid pad 13c by a slot 27. In this embodiment, one or more second electrodes 18b are formed on the substrate 11 outside CMOS device layer section 13f with respect to diaphragm 13a. A second electrode 18b is connected to CMOS pad 18c1 by a second bonding wire 80. A cross-sectional view along the plane 30-30 is shown in FIG. 6b. Thus, the variable capacitor circuit shown in FIGS. 5a, 5b is modified slightly by replacing certain vias with bonding wire connections to provide a second SOI embodiment shown in FIGS. 6a, 6b.

Figure 11:
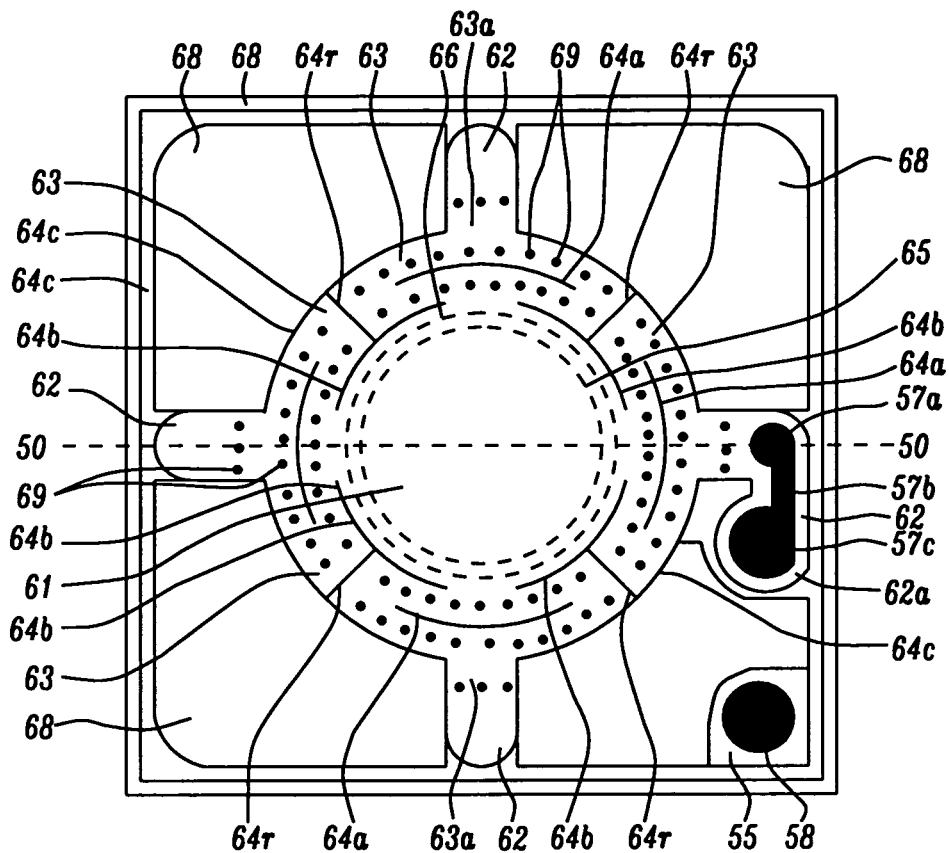
FIG. 11 is top view of a silicon microphone sensing element according to a ninth embodiment of the present invention that includes a diaphragm having double folded supporting springs with perforations and at least one extended anchor for wire bonding.
Figure 12:
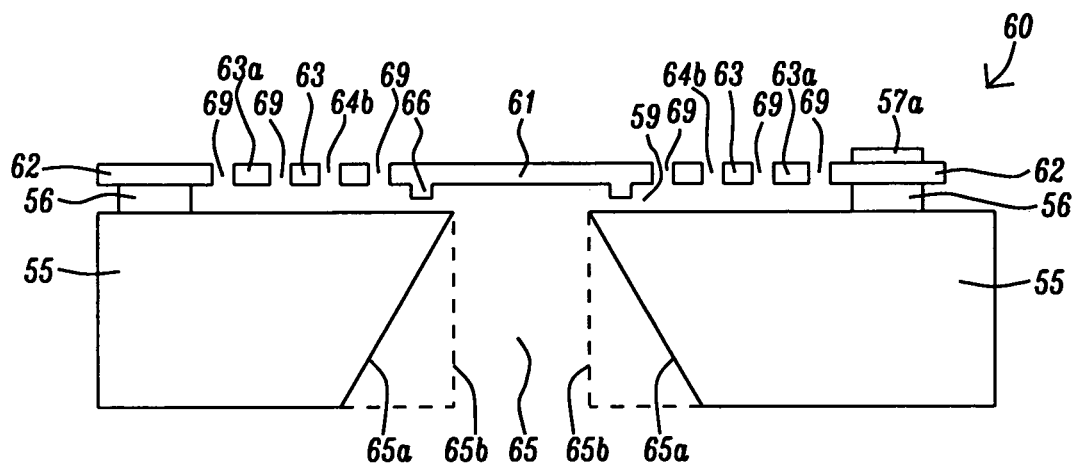
FIG. 12 is a cross-sectional view of a microphone sensing element shown in FIG. 11.

The present invention also encompasses embodiments represented by FIGS. 7-10 that were first presented in related patent application Ser. No. 11/973,075 and a related embodiment that includes an extended anchor pad and an additional set of slot openings in the perforated springs as depicted in FIGS. 11-12. Furthermore, it should be understood that the embodiments in FIGS. 7-10 may be modified by including one or more features in other embodiments described herein such as modification of one or more rigid anchor pads to have an extended structure as in FIGS. 11-12. Additionally, the silicon microphone structures shown in FIGS. 7-12 may be modified to include a CMOS device layer that comprises one or more CMOS devices so that a backplateless silicon microphone may be integrated with CMOS architecture as described with respect to FIGS. 5-6. The structures shown in FIGS. 7-12 may be amended such that the beams 63a may be replaced by a plurality of "L" shaped perforated springs as shown in FIG. 1.

Figure 7:
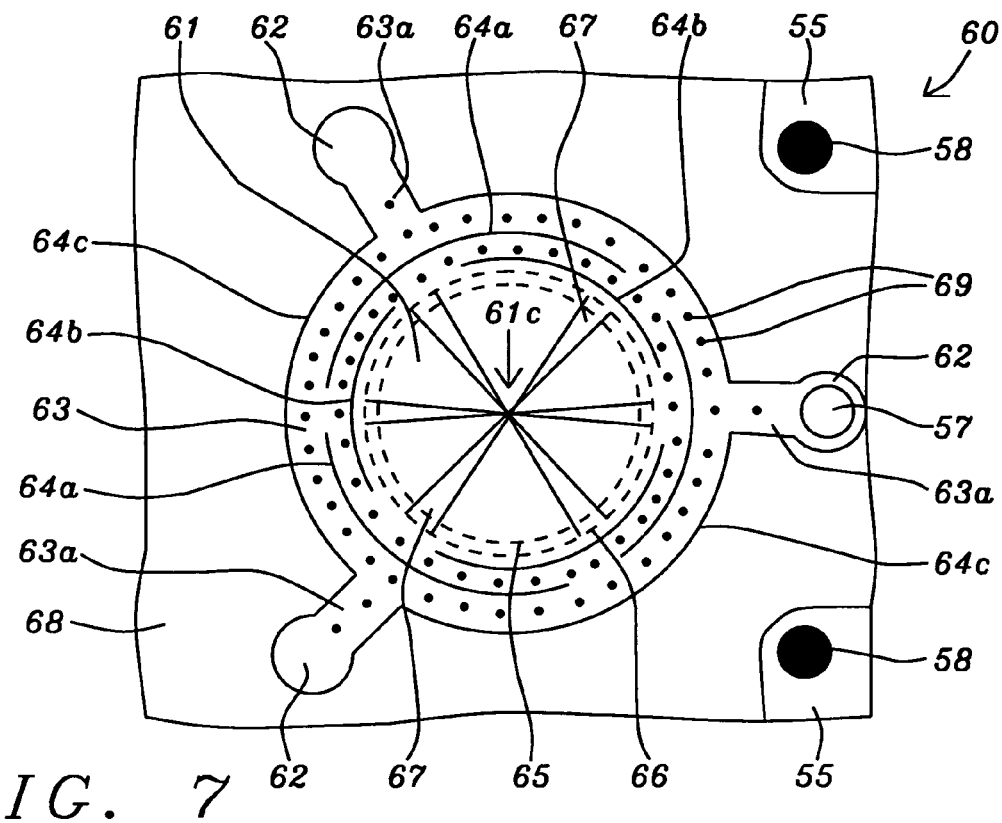
FIG. 7 is a top view of a microphone sensing element according to a fifth embodiment of the present invention.

FIGS. 7-10 all illustrate a silicon microphone element 60 having a spring 63 with perforations 69 and an inner edge that adjoins a diaphragm 61. The perforated spring 63 has an outer edge connected to a plurality of rigid anchor pads 62. In the exemplary embodiments, the perforated spring 63 is connected to the rigid anchor pads through a plurality of perforated spring extensions or beams 63a radiating outward from the outer edge of perforated spring 63 in which each beam has an end attached to a rigid anchor pad 62. The diaphragm center 61c is formed above a back hole 65 which has a geometric area less than that of the diaphragm. A rib structure 66 is formed on the bottom surface of the diaphragm 61 and faces the back hole. A continuous outer slot 64c surrounds the spring 63 and plurality of rigid anchor pads 62 and separates the aforementioned elements from a patterned membrane layer 68 from which the diaphragm 61, spring 63, beams 63a, and rigid pads 62 are made. The rib structure 66 is formed at a greater distance from the diaphragm center 61c than the back hole 65 in order to help seal the air gap (not shown) above the back hole and minimize acoustical leakage. Moreover, there may be reinforcements 67 formed on the bottom surface of the diaphragm which radiate outward like spokes from the diaphragm center 61c and connect with ribs 66 as shown in FIG. 7. A first electrode 57 is formed on one or more rigid pads 62 and one or more second electrodes 58 are disposed on the substrate 55 outside the continuous outer slot 64c. The plurality of rigid pads 62 are formed on a dielectric layer (not shown) that serves as a spacer between the substrate 55 and rigid pads and also between the substrate and membrane layer 68.

The composition of the substrate 55, dielectric spacer, membrane layer 68, as well as first electrodes 57, and second electrodes 58 may be the same as the corresponding elements in the previous embodiments. Furthermore, the shape of the diaphragm 61 may be circular or polygonal and the perforated spring 63 preferably has an inner edge that conforms to the shape of the diaphragm.

Figure 8:
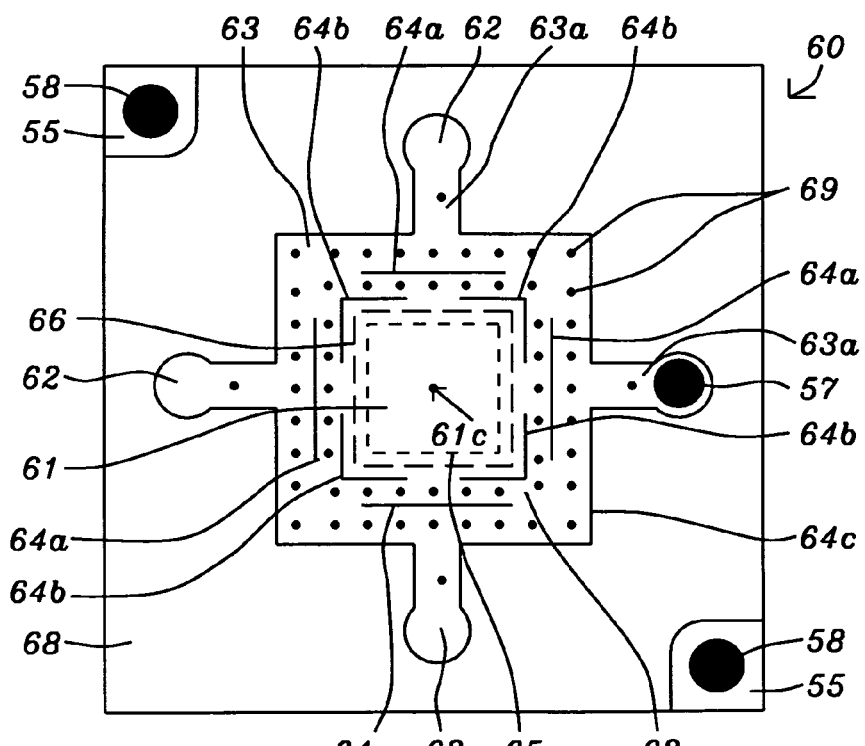
FIG. 8 is a top view of a microphone sensing element according to a sixth embodiment of the present invention.
Figure 9:
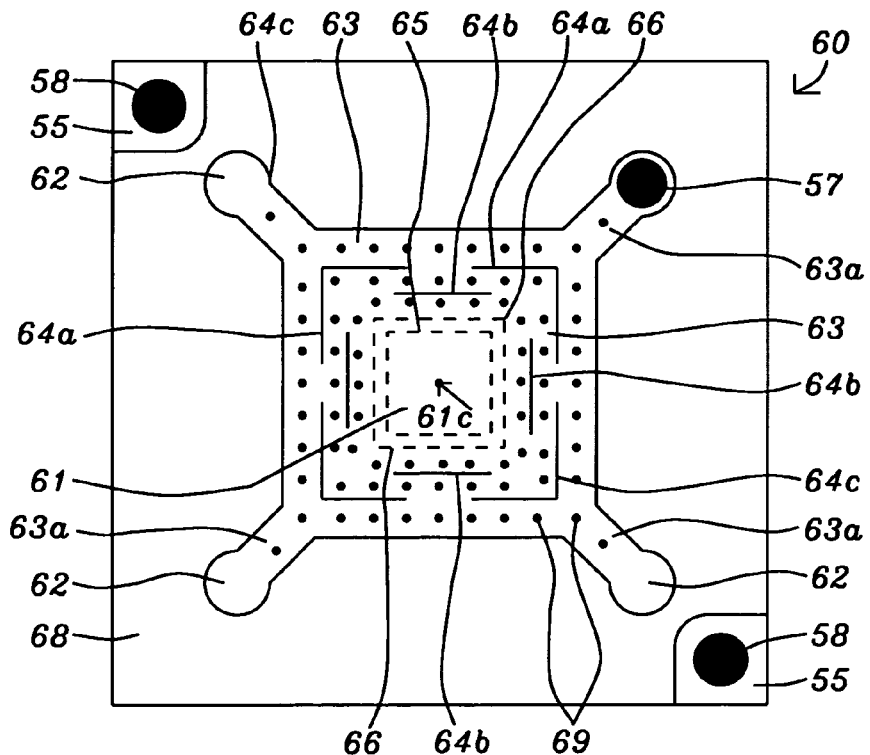
FIG. 9 is a top-view showing a microphone sensing element according to a seventh embodiment of the present invention.

Another feature illustrated in FIGS. 7-9 is a double folded perforated spring 63 which has additional flexibility over prior art mechanical springs that do not have folding capability. The double folding capability is derived from slot openings hereafter called slots. In one embodiment, there is a plurality of inner slots 64b that separate the diaphragm 61 from the perforated spring 63. The inner slots 64b may have a shape that is a straight line (FIG. 9), or may have an arc shape (FIG. 7), a chevron (L) shape as in FIG. 8, or another line shape comprising an angle between 0° and 180°. Typically, the slot shape is determined by the shape of the diaphragm 61 which may be circular or polygonal. In other words, the perforated spring 63 surrounding the diaphragm 61 preferably conforms to the shape of the outer edge of the diaphragm and the slots 64a, 64b, 64c are selected to be compatible with the perforated spring shape. Note that a plurality of middle slots 64a are formed between the inner slots 64b and the continuous outer slot 64c and may have the form of a straight line, arc, or chevron similar to the inner slots 64a. In one aspect, the inner slots 64b may have a first shape while the middle slots 64a may have a second shape different than the first shape. The continuous outer slot 64c generally conforms to the shape of the spring 63, beams 63a, and rigid anchor pads 62.

Figure 10:
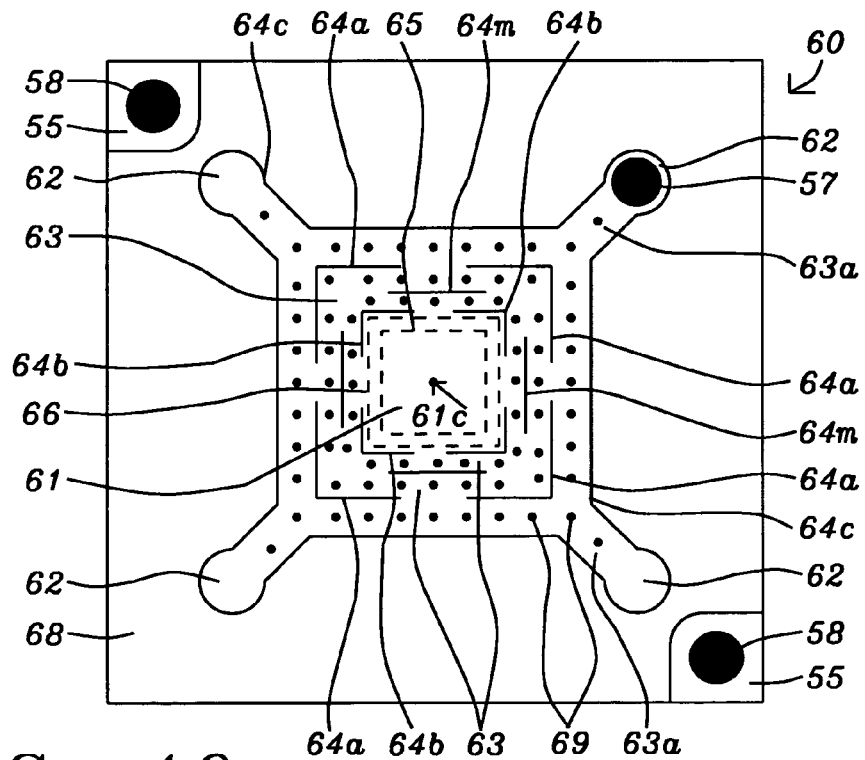
FIG. 10 is a top view of a microphone sensing element according to an eighth embodiment of the present invention.

The triple folded spring 63 design shown in FIG. 10 is a further improvement over the double folded spring in FIGS. 7-9 because an additional set of middle slots 64m affords more flexibility to the movable spring and diaphragm 61. Note that the additional middle slots 64m are formed between the inner slots 64b and middle slots 64a and may have a straight line or angle shape that is different than the chevron shape of the middle slots 64a and inner slots. Optionally, the additional middle slots 64m may have a chevron shape while middle slots 64a and inner slots 64b have a straight line shape. In yet another embodiment (not shown), all three sets of slots 64a, 64b, 64m may have an arc shape when the spring 63 and diaphragm 61 are circular.

Referring to FIG. 11, another embodiment of a backplateless silicon microphone according to the present invention is depicted and represents a double folding perforated spring design in which one or more of the rigid anchor pads 62 may be modified to have an extension along a plane that is formed at an angle>0° relative to the plane that passes through the diaphragm center and bisects a beam 63a. For example, there may be a rigid anchor pad 62 with an extension 62a formed along a plane that is perpendicular to the plane 50-50.

This embodiment may be considered a modification of the embodiments described with respect to FIGS. 1-6b except that the diaphragm is circular rather than square or polygonal. Furthermore, an "end" may be interchangeably used with the term "side" when referring to the edge of a spring that is attached to the diaphragm or a rigid pad. The plurality of springs is retained from the earlier embodiments but in this case each spring has a double folding configuration that includes a plurality of "n" side slot openings (side slots) 64r which essentially separate adjacent perforated springs 63 from each other. In the exemplary embodiment, n=4 which affords a total of four perforated springs 63 surrounding the diaphragm 61. Each perforated spring may have an independent motion since adjacent perforated springs 63 are separated by a side slot 64r which imparts further flexibility to the movable parts including diaphragm 61. Preferably, each side slot 64r has a straight line shape and connects an inner slot 64b with the continuous outer slot 64c. However, the present invention also anticipates that the side slots 64r may have a shape other than a straight line.

In this embodiment, each of the plurality of inner slots 64b may contact two perforated springs 63 and each inner slot has a shape that is conformal to the outer edge of the diaphragm. In the exemplary embodiment, each inner slot 64b has an arc shape that conforms to the circular edge of the diaphragm. Furthermore, the inner side of each perforated spring 63 conforms to the outer edge of the diaphragm 61. Optionally, the shape of diaphragm 61 may be polygonal with "n" perforated springs 63 attached to the outer edge of the diaphragm wherein each perforated spring has an inner side that conforms to the outer edge of the diaphragm.

The double folded definition of the perforated springs 63 in this embodiment is derived from a plurality of middle slots 64a wherein one or more middle slots may be formed in each perforated spring 63 to provide additional bending flexibility to the silicon microphone element. Preferably, a middle slot 64a is formed between the outer and inner sides of a perforated spring and conforms to the circular shape of the inner slots 64b and diaphragm edge. The back hole 65 may have a circular or polygonal shape. Note that perforations 69 may be formed between the middle slots 64a and inner slots 64b, between the middle slots 64a and continuous outer slot 64c, and within the perforated beams 63a.

The significance of the anchor pad extension 62a is that the additional area of the combined anchor pads 62, 62a may be advantageously used to buffer the stress induced by thermosonic wire bonding. For example, a first conductive element 57a may be formed on an anchor pad 62 along the plane 50-50 and may be connected by a conductive line 57b to a larger wire bonding pad or conductive element 57c that is formed on the anchor pad extension 62a. Conductive elements 57a, 57b, and 57c may be considered as a first electrode. A second electrode 58 may be formed on the substrate 51. The two electrodes are connected by wire bonding in a subsequent step to establish a variable capacitor circuit where capacitive sensing is realized between a movable element (diaphragm 61 and perforated spring 63) and a fixed element (silicon substrate 51).

It should also be understood that reinforcements (not shown) may be added to the bottom surfaces of a thin diaphragm 61 so as to realize a piston-like movement. Reinforcements may serve to strengthen the diaphragm 61 and in one embodiment are arranged like spokes radiating from the center of the diaphragm. Ribs 66 may form a ring outside the back hole 65 that is concentric with the diaphragm shape. Ring shaped ribs 66 serve to reduce acoustic leakage through the air gap. The back hole 65 preferably has a top opening facing the diaphragm 61 that has a smaller geometric area than the geometric area of the diaphragm in a plane parallel to the substrate 51 in order to avoid acoustic leakage.

Referring to FIG. 12, a cross-sectional view along the plane 50-50 of the silicon microphone element in FIG. 11 shows that a dielectric spacer layer 56 is formed on the substrate 51 and those skilled in the art will recognize that the dielectric spacer is selectively removed in regions below the diaphragm 61 and perforated springs 63 to form an air gap 59. The dielectric spacer layer 56 may be a single layer or composite layer comprised of a thermal oxide, a low temperature oxide, a TEOS layer, a PSG layer, frit glass, or silicon nitride. The back hole 65 may have vertical sidewalls 65b or sloped sidewalls 65a as illustrated in previous embodiments.

Figure 13:
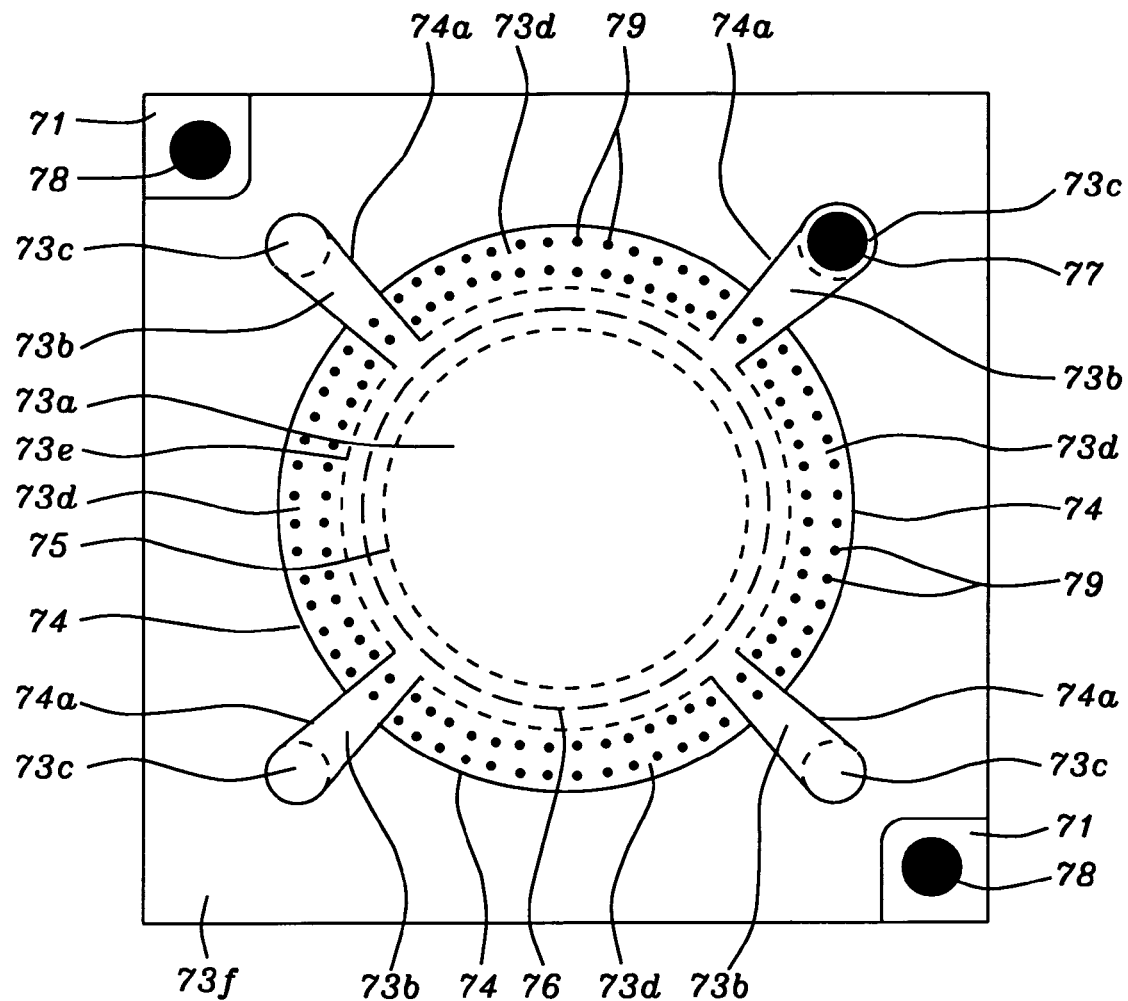
FIG. 13 is a top view of a microphone sensing element according to a tenth embodiment of the present invention.

Referring to FIG. 13, the present invention also anticipates other embodiments wherein both perforated plates and perforated springs are included in a silicon microphone element. In the exemplary embodiment, a diaphragm 73a is adjoined along an outer edge 73e by a plurality of plates 73d with perforations 79. Each perforated plate 73d has an outer edge defined by an outer slot 74 so that the outer edge is not constrained, an inner edge defined by the diaphragm edge 73e, and two sides that are adjacent to "U" shaped slots 74a wherein each "U" shaped slot surrounds a perforated spring 73b and attached rigid anchor pad 73c. The open end of the "U" shape represents the location where the perforated spring 73b adjoins the diaphragm edge 73e. The outer slot 74 and "U" shaped slots 74a separate the plates 73d, perforated springs 73b, and rigid pads 73c from the surrounding membrane film 73f that may be comprised of silicon, polysilicon, Au, Cu, Ni, or other metal materials There is also a back hole 75 formed in the substrate 71 below the diaphragm 73a and a rib structure 76 formed on the bottom surface of the diaphragm and facing the back hole. Preferably, the rib structure 76 is positioned a greater distance from the diaphragm center than the back hole 75. The back hole 75 may have a circular or polygonal shape such as a square with a first geometric area that is less than the geometric area of said diaphragm in a plane parallel to said front side to avoid acoustical leakage. The back hole may have vertical sidewalls with respect to the plane of the substrate or may have sidewalls that are sloped wherein the opening in the back side of the substrate has a second geometric area that is a different size than the first geometric area.

At least one of the plurality of rigid anchor pads 73c has a first electrode 77 formed thereon. Moreover, there are one or more second electrodes 78 formed on substrate 71 at locations outside the outer slot 74 with respect to diaphragm 73a. A dielectric layer (not shown) under rid pads 73c also serves as a spacer between substrate 71 and membrane layer 73f. Movable plates 73d, perforated springs 73b, and diaphragm 73a are formed over an air gap (not shown).

A variable capacitor circuit includes a first electrode 77 and a second electrode 78 and is used for capacitance sensing purposes to detect the movement of diaphragm 73a, perforated plates 73d, and perforated springs 73b relative to a fixed substrate 71 and convert the capacitance change into electrical signals. Improved impact proof reliability in the backplateless silicon microphone depicted in FIG. 13 can be achieved through a wire bonding scheme that has been described previously.

The present invention also encompasses an embodiment wherein a plurality of perforated plates adjoin a diaphragm at certain locations and each perforated plate is enclosed on three sides by a continuous perforated spring that is also attached to the diaphragm and to a plurality of rigid anchor pads as depicted in FIG. 1a of related patent application Ser. No. 11/973,075. Each perforated plate is separated from the surrounding spring by a plurality of slot openings. The present invention also anticipates that each of embodiments described herein may be modified to include more than one back hole in the substrate as illustrated in FIG. 13 in related patent application Ser. No. 10/977,692.

All embodiments of the microphone sensing element described herein have a similar advantage over prior art in that the resulting silicon microphone has no dedicated backplate and thus can be produced at a lower cost with fewer photomasks than heretofore required. A suitable backplateless silicon microphone fabrication method has been included in related patent application Ser. No. 10/977,692 and can be easily modified by those skilled in the art to construct the embodiments of the present invention. Furthermore, a microphone sensing element according to the present invention can exhibit good performance that is equivalent to results obtained from prior art microphone sensing elements with a dedicated backplate feature. Improved impact proof reliability over the prior art can be achieved by adapting one of the wire bonding schemes described in related patent application Ser. No. 11/973,075.

While this invention has been particularly shown and described with reference to, the preferred embodiments thereof, it will be understood by those skilled in the art that various changes in form and details may be made without departing from the spirit and scope of this invention.

I claim:

1. A microphone sensing element without a dedicated backplate, comprising:
    (a) a substrate having front and back sides with one or more back holes formed therein;
    (b) a dielectric spacer layer formed on the front side of the substrate;
    (c) a diaphragm that is aligned above said one or more back holes;
    (d) a plurality of rigid pads formed on said dielectric spacer layer;
    (e) a plurality of perforated springs wherein each perforated spring has a side that is separated from a nearest diaphragm side by a gap; and has a first end attached to a substantial portion of the nearest side of said diaphragm and a second end that is connected to one of said rigid pads, each perforated spring has a lengthwise dimension formed parallel to the nearest diaphragm side, said perforated springs and diaphragm are suspended above an air gap overlying the substrate, and said diaphragm, plurality of rigid pads, plurality of perforated springs are patterned in a same membrane layer with a plurality of holes and slot openings whereby holes in the perforated springs allow air ventilation through the perforated springs and thereby reduce air damping in the air gap during vibrations of the perforated springs and diaphragm; and
    (f) a first electrode formed on one or more of said rigid pads and one or more second electrodes formed on the substrate wherein a first electrode and a second electrode establish a variable capacitor circuit when said diaphragm and said perforated springs vibrate up and down in a direction perpendicular to said substrate in response to a sound signal.

2. The microphone sensing element of claim 1 wherein the diaphragm has a circular, square, rectangular, or polygonal shape.

3. The microphone sensing element of claim 1 wherein said one or more back holes have circular, square, rectangular, or polygonal openings in the front side of the substrate that have a geometric area less than that of the diaphragm to avoid acoustical leakage, and wherein said one or more back holes have openings in the back side of the substrate that may be different in size from the openings in the front side of the substrate.

4. The microphone sensing element of claim 1 wherein each of the plurality of perforated springs has a rectangular, polygonal, "U" shape, "L" shape, or a shape that combines two or more of the aforementioned shapes, and wherein one or more of the plurality of perforated springs may have a first shape and one or more of said plurality of perforated springs may have a second shape.

5. The microphone sensing element of claim 1 further comprised of a plurality of perforated plates wherein each perforated plate has an inner edge attached to said diaphragm and an outer edge free of any constraints.

6. The microphone sensing element of claim 1 wherein the membrane layer is a single layer or a composite film comprised of single crystalline silicon, poly-crystalline silicon, silicon nitride, Au, Cu, Ni, Al, or other metal materials that may be alloys.

7. The microphone sensing element of claim 1 wherein the substrate is comprised of doped silicon having a low resistivity, silicon having a conductive layer formed thereon, silicon having a composite represented by a dielectric layer/conductive layer/dielectric spacer formed thereon, or glass having a conductive layer formed thereon.

8. The microphone sensing element of claim 1 wherein said air gap is defined in said dielectric spacer layer that may be a single layer or composite layer comprised of a thermal oxide, a low temperature oxide, a TEOS layer, a PSG layer, frit glass, or silicon nitride.

9. The microphone sensing element of claim 1 wherein a first electrode and a second electrode are comprised of a Au/Cr composite layer, or are a single or composite layer comprised of Al, W, Ti, Ta, Ni, Cu, or other metal materials.

10. The microphone sensing element of claim 1 wherein said diaphragm has a square or polygonal shape and said plurality of perforated springs has a "L" shape with the base of the "L" shape attached to the diaphragm and the long portion of the "L" shape having a side that faces the diaphragm and is separated from the diaphragm by the gap that is an inner slot opening, and having a side opposite the diaphragm that is separated from a surrounding membrane layer by an outer slot.

11. A microphone sensing element without a dedicated backplate, comprising:
(a) a substrate having front and back sides with one or more back holes formed therein;
(b) a dielectric spacer layer formed on the front side of the substrate;
(c) a diaphragm that is aligned above said one or more back holes, the diaphragm has reinforcements formed on a bottom surface thereof and radiating from a center of the diaphragm to connect to ribs which form a ring shape outside the one or more back holes;
(d) a plurality of rigid pads formed on said dielectric layer;
(e) a perforated spring with an inner edge adjoining and surrounding said diaphragm and an outer edge connected to said plurality of rigid pads, said perforated spring and diaphragm are suspended above an air gap overlying the substrate, and said diaphragm, perforated spring, and rigid pads are patterned in a same membrane layer comprised of a plurality of holes and a plurality of slot openings whereby holes in the perforated spring allow air ventilation through the perforated springs and thereby reduce air damping in the air gap during vibrations of the perforated spring and diaphragm; and
(f) a first electrode formed on one or more of said rigid pads and one or more second electrodes formed on the substrate wherein a first electrode and a second electrode establish a variable capacitor circuit when said diaphragm and said perforated spring vibrate up and down in a direction perpendicular to said substrate in response to a sound signal.

12. The microphone sensing element of claim 11 wherein the diaphragm has a circular, square, rectangular, or polygonal shape and the inner edge of the perforated spring conforms to the shape of the diaphragm.

13. The microphone sensing element of claim 11 wherein said one or more back holes have circular, square, rectangular, or polygonal openings in the front side of the substrate that have a geometric area less than that of the diaphragm to avoid acoustical leakage, and wherein said one or more back holes have openings in the back side of the substrate that may be different in size from the openings in the front side of the substrate.

14. The microphone sensing element of claim 11 wherein said membrane layer is a single or composite film comprised of single crystalline silicon, poly-crystalline silicon, silicon nitride, Au, Cu, Ni, Al, or other metal materials that may be alloys.

15. The microphone sensing element of claim 11 wherein the substrate is comprised of doped silicon having a low resistivity, silicon having a conductive layer formed thereon, silicon having a composite represented by a dielectric layer/conductive layer/dielectric spacer formed thereon, or glass having a conductive layer formed thereon.

16. The microphone sensing element of claim 11 wherein said air gap is defined in said dielectric spacer layer that may be a single layer or composite layer comprised of a thermal oxide, a low temperature oxide, a TEOS layer, a PSG layer, frit glass, or silicon nitride.

17. The microphone sensing element of claim 11 wherein a first electrode and a second electrode are comprised of a Au/Cr composite layer, or are a single or composite layer comprised of Al, W, Ti, Ta, Ni, Cu, or other metal materials.

18. A microphone transducer without a dedicated backplate, comprising:
(a) a substrate having front and back sides with one or more back holes formed therein;
(b) a dielectric spacer layer formed on the front side of the substrate;
(c) a diaphragm having an outer edge that is aligned above said one or more back holes;
(d) a plurality of rigid pads formed on said dielectric spacer layer;
(e) a plurality of perforated springs having two ends wherein one end of each perforated spring is attached to an outer edge of said diaphragm and a second end is attached to one of said rigid pads, said plurality of perforated springs and diaphragm are suspended above an air gap that overlying the substrate, each of the perforated springs comprise a plurality of holes that allow air ventilation through the perforated spring and thereby reduce air damping in the air gap during vibrations of the perforated springs and diaphragm;
(f) a first electrode formed on the one or more of said rigid pads and one or more second electrodes that are formed on the substrate wherein in a first electrode and a second electrode establish a variable capacitor circuit when said diaphragm and said plurality of perforated springs vibrate up and down in a direction perpendicular to said substrate in response to a sound signal; and
(g) one or more CMOS devices adjacent to said diaphragm, plurality of perforated springs, and plurality of rigid pads wherein said one or more CMOS devices are electrically connected to said first and second electrodes to convert the variable capacitance to analog or digital electrical output.

19. The microphone transducer of claim 18 wherein said diaphragm, plurality of perforated springs, and plurality of rigid pads are patterned in a silicon device layer portion of a SOI wafer with a plurality of holes and slot openings formed therein and said plurality of perforated springs and plurality of rigid pads are separated from a surrounding device layer by a continuous slot opening.

20. The microphone transducer of claim 18 wherein said dielectric spacer layer is a buried oxide (BOX) layer formed on a silicon substrate.

21. The microphone transducer of claim 18 wherein said one or more CMOS devices are formed on the silicon device layer surrounding the diaphragm, perforated springs and rigid pads, and are electrically connected to said first electrode and second electrode through via pads or bonding wires.

22. The microphone transducer of claim 18 further comprised of a plurality of perforated plates that adjoin said diaphragm.

* * * * *